(12) United States Patent
Yamazaki et al.

(10) Patent No.: US 10,351,951 B2
(45) Date of Patent: Jul. 16, 2019

(54) SUBSTRATE TREATMENT APPARATUS INCLUDING REACTION TUBE WITH OPENED LOWER END, FURNACE OPENING MEMBER, AND FLANGE CONFIGURED TO COVER UPPER SURFACE OF THE FURNACE OPENING MEMBER

(71) Applicant: HITACHI KOKUSAI ELECTRIC INC., Tokyo (JP)

(72) Inventors: Keishin Yamazaki, Toyama (JP); Satoru Murata, Toyama (JP); Shinya Morita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/665,917

(22) Filed: Aug. 1, 2017

(65) Prior Publication Data

US 2017/0335452 A1    Nov. 23, 2017

Related U.S. Application Data

(63) Continuation of application No. PCT/JP2016/052124, filed on Jan. 26, 2016.

(30) Foreign Application Priority Data

Feb. 4, 2015   (JP) ................................. 2015-019919

(51) Int. Cl.
| | |
|---|---|
| *C30B 25/14* | (2006.01) |
| *C23C 16/455* | (2006.01) |
| *H01L 21/31* | (2006.01) |
| *H01L 21/02* | (2006.01) |

(Continued)

(52) U.S. Cl.
CPC .......... *C23C 16/455* (2013.01); *C23C 16/345* (2013.01); *C23C 16/4409* (2013.01);
(Continued)

(58) Field of Classification Search
CPC ..... C23C 16/345; C23C 16/44; C23C 16/455; C23C 16/4409; C23C 16/45519;
(Continued)

(56) References Cited

U.S. PATENT DOCUMENTS 8,043,431 B2    10/2011 Ozaki et al.
8,282,737 B2    10/2012 Ozaki et al.
(Continued)

FOREIGN PATENT DOCUMENTS

JP    2002-093733 A    3/2002
JP    2005-235937 A    9/2005
(Continued)

OTHER PUBLICATIONS

International Search Report for WO 2016/125626 A1, dated Apr. 26, 2016.

*Primary Examiner* — Kenneth A Bratland, Jr.
(74) *Attorney, Agent, or Firm* — Volpe and Koenig, P.C.

(57) ABSTRACT

A substrate treatment apparatus includes: a reaction tube including a substrate treatment region in which a substrate is treated; and a furnace opening member disposed in a lower portion of the reaction tube. The reaction tube includes a flange formed to protrude outward in the lower portion of the reaction tube, and an extension portion formed to extend downward from a lower end of the flange, the extension portion being formed to have a thickness larger than a thickness of the reaction tube at a position corresponding to the substrate treatment region, and being configured to cover an inner circumferential surface of the furnace opening member. An inner surface of the extension portion protrudes more inward than an inner surface of the reaction tube at the position corresponding to the substrate treatment region.

14 Claims, 5 Drawing Sheets

(51) Int. Cl.
*C23C 16/34* (2006.01)
*C23C 16/44* (2006.01)
*H01L 21/67* (2006.01)
*H01L 21/673* (2006.01)

(52) U.S. Cl.
CPC ........ C23C 16/45519 (2013.01); H01L 21/02 (2013.01); H01L 21/0217 (2013.01); H01L 21/31 (2013.01); H01L 21/67017 (2013.01); H01L 21/67109 (2013.01); *H01L 21/02211* (2013.01); *H01L 21/02271* (2013.01); *H01L 21/6732* (2013.01)

(58) Field of Classification Search
CPC ......... C30B 25/00; C30B 25/02; C30B 25/08; C30B 25/10; C30B 25/14; H01L 21/02; H01L 21/0217; H01L 21/31; H01L 21/67017; H01L 21/67109; H01L 21/02211; H01L 21/02271; H01L 21/6732
USPC .... 118/715, 724, 728, 733; 117/84, 88, 102, 117/200, 204
See application file for complete search history.

(56) References Cited

U.S. PATENT DOCUMENTS

| | | | |
|---|---|---|---|
| 2006/0150904 A1* | 7/2006 | Ozaki | C23C 16/4401 118/715 |
| 2007/0051312 A1* | 3/2007 | Sneh | C23C 14/566 118/719 |
| 2009/0116936 A1* | 5/2009 | Marubayashi | H01L 21/67109 414/148 |
| 2009/0170338 A1* | 7/2009 | Terasaki | C23C 16/4412 438/758 |
| 2017/0088948 A1 | 3/2017 | Takagi et al. | |

FOREIGN PATENT DOCUMENTS

| | | |
|---|---|---|
| JP | 2006-093200 A | 4/2006 |
| JP | 2007-227470 A | 9/2007 |
| JP | 4820850 A | 11/2011 |
| JP | 2014-090145 A | 5/2014 |
| JP | 2014-201803 A | 10/2014 |
| JP | 2014-209572 | 11/2014 |

* cited by examiner

SUBSTRATE TREATMENT APPARATUS INCLUDING REACTION TUBE WITH OPENED LOWER END, FURNACE OPENING MEMBER, AND FLANGE CONFIGURED TO COVER UPPER SURFACE OF THE FURNACE OPENING MEMBER

CROSS-REFERENCE TO RELATED APPLICATIONS

This application is a bypass continuation application of international application No. PCT/JP2016/052124 having an international filing date of Jan. 26, 2016 and designating the United States, the international application being based upon and claiming the benefit of priority from Japanese Patent Application No. 2015-019919, filed on Feb. 4, 2015, the entire contents of which are incorporated herein by reference.

TECHNICAL FIELD

The present disclosure relates to a substrate treatment apparatus, a reaction tube and a method of manufacturing a semiconductor device.

BACKGROUND

As an example of a semiconductor manufacturing process, there is a film forming process of depositing a predetermined thin film on a substrate by using a CVD (Chemical Vapor Deposition) method or the like.

When performing such a film forming process, for example, a vertical substrate treatment apparatus is used. For example, the vertical substrate treatment apparatus includes a process tube composed of an inner tube and an outer tube. A plurality of wafers held by a boat is carried into a cylindrical hollow portion of the inner tube. A gap between a lower end of the inner tube and a lower end of the outer tube is air-tightly sealed by a metal-made furnace opening flange formed in a circular ring shape.

In a case where a furnace opening member is formed at the lower end of the reaction tube and a gas introduction pipe is fixed to the furnace opening member, by-products may adhere to a low temperature portion such as a wall surface inside the furnace opening member of the lower portion of the reaction tube or the like. The adhered by-products may cause particles or the like.

SUMMARY

The present disclosure provides some embodiments of a technique capable of suppressing the adhesion of by-products in the vicinity of a furnace opening member.

According to one embodiment of the present disclosure, there is provided a substrate treatment apparatus which includes: a reaction tube including a substrate treatment region in which a substrate is treated; and a furnace opening member disposed in a lower portion of the reaction tube, wherein the reaction tube includes a flange formed to protrude outward in the lower portion of the reaction tube, and an extension portion formed to extend downward from a lower end of the flange, the extension portion being formed to have a thickness larger than a thickness of the reaction tube at a position corresponding to the substrate treatment region, and being configured to cover an inner circumferential surface of the furnace opening member, and wherein an inner surface of the extension portion protrudes more inward than an inner surface of the reaction tube at the position corresponding to the substrate treatment region.

BRIEF DESCRIPTION OF DRAWINGS

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

DETAILED DESCRIPTION

Embodiments of the present disclosure will now be in detail described with reference to the accompanying drawings. In the following detailed description, numerous specific details are set forth in order to provide a thorough understanding of the present disclosure. However, it will be apparent to one of ordinary skill in the art that the present disclosure may be practiced with out these specific details. In other instances, well-known methods, procedures, systems, and components have not been described in detail so as not to unnecessarily obscure aspects of the various embodiments.

Figure 1:
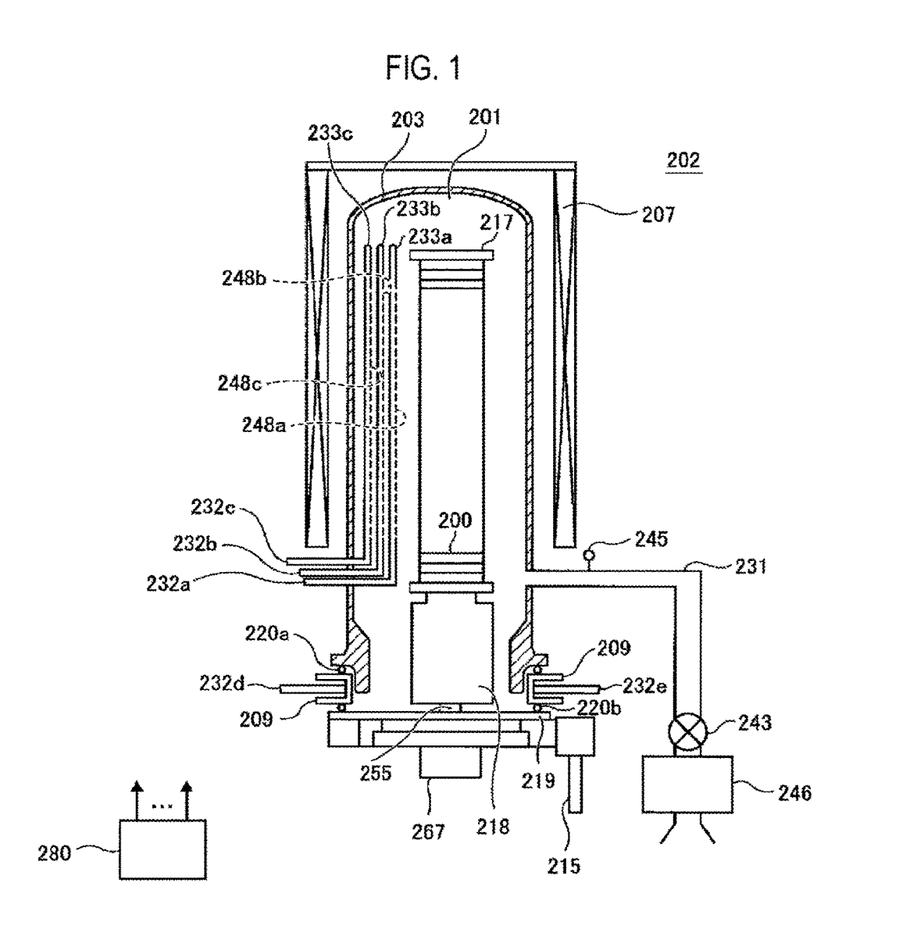
FIG. 1 is a schematic configuration diagram of a substrate treatment apparatus suitably used in an embodiment of the present disclosure.

As shown in FIG. 1, a processing furnace 202 includes a heater 207 as a heating means (heating mechanism). The heater 207 has a cylindrical shape and is vertically installed while being supported by a heater base as a holding plate.

Inside the heater 207, a reaction tube 203 is arranged concentrically with the heater 207. The reaction tube 203 is made of, for example, a heat resistant material such as quartz ($SiO_2$) or silicon carbide (SiC), and is formed in a cylindrical shape with its upper end closed and its lower end opened. A process chamber 201 is formed in a cylindrical hollow portion of the reaction tube 203. The process chamber 201 is configured to accommodate wafers 200 as substrates in a state in which the wafers 200 are aligned in a horizontal posture and in multiple stages in a vertical direction by a boat 217 as a substrate holding tool.

An exhaust pipe 231 for exhausting an internal atmosphere of the process chamber 201 is installed below the reaction tube 203. A vacuum pump 246 as a vacuum exhaust device is coupled to the exhaust pipe 231 via a pressure sensor 245 as a pressure detector and an APC (Auto Pressure Controller) valve 243 as a pressure regulator. By adjusting an opening degree of the APC valve 243 based on a pressure information detected by the pressure sensor 245, the process chamber 201 can be vacuum-exhausted so that an internal pressure of the process chamber 201 becomes a predetermined pressure (degree of vacuum). The APC valve 243 is an on-off valve configured so that the vacuum exhaust of the interior of the process chamber 201 can be performed and stopped by opening and closing the on-off valve and so that the internal pressure of the process chamber 201 can be regulated by adjusting the opening degree of the on-off valve 243.

Further, a first nozzle 233a as a first gas introduction part, a second nozzle 233b as a second gas introduction part and a third nozzle 233c as a third gas introduction part are connected to the lower portion of the reaction tube 203 so as to penetrate the reaction tube 203. Each of the first nozzle 233a, the second nozzle 233b and the third nozzle 233c is formed in an L shape so as to have a horizontal portion and a vertical portion. The horizontal portion is connected to the side wall of the reaction tube 203. The vertical portion is installed in an arc-shaped space defined between the inner wall of the reaction tube 203 and the wafers 200 so as to extend upward in the stacking direction of the wafers 200 from the lower portion of the reaction tube 203 along the inner wall of the upper portion of the reaction tube 203. First gas supply holes 248a, second gas supply holes 248b and third gas supply holes 248c, which are supply holes through which process gases are respectively supplied, are formed in lateral surfaces of the vertical portions of the first nozzle 233a, the second nozzle 233b and the third nozzle 233c, respectively.

In the present embodiment, a gas supply part 232a for supplying a first process gas is connected to the first nozzle 233a. A gas supply part 232b for supplying a second process gas is connected to the second nozzle 233b. A gas supply part 232c for supplying a third process gas is connected to the third nozzle 233c.

A furnace opening member (also referred to as an inlet or a manifold) 209 formed concentrically with the reaction tube 203 is disposed in the lower portion of the reaction tube 203. The furnace opening member 209 is made of metal such as stainless steel (SUS material), nickel (Ni) alloy or the like, and is formed in a cylindrical shape with its upper end and lower end opened. An inert gas supply part and the like are fixed to the furnace opening member 209. In addition, the furnace opening member 209 is installed so as to support the reaction tube 203. An O ring 220a as a seal member is installed between the furnace opening member 209 and the reaction tube 203. A combination of the reaction tube 203 and the furnace opening member 209 constitutes a reaction vessel.

A seal cap 219 as a furnace opening lid capable of air-tightly closing a lower end opening of the furnace opening member 209 is installed below (at the lower end of) the furnace opening member 209. The seal cap 219 is configured to be brought into contact with the lower end of the furnace opening member 209 from the lower side in the vertical direction. The seal cap 219 is made of, for example, metal such as stainless steel or the like, and is formed in a disc shape. On the upper surface of the seal cap 219, there is installed an O ring 220b as a seal member which bring into contact with the lower end of the furnace opening member 209. At the opposite side of the seal cap 219 from the process chamber 201, a rotation mechanism 267 for rotating a boat 217 to be described later is installed. A rotation shaft 255 of the rotation mechanism 267 penetrates through the seal cap 219 and is connected to the boat 217. The rotation shaft 255 is configured to rotate the wafers 200 by rotating the boat 217. The boat 217 and the seal cap 219 are configured to be raised and lowered in the vertical direction by a boat elevator 215 as an elevating mechanism disposed outside the reaction tube 203. Thus, the boat 217 can be loaded into and unloaded from the process chamber 201.

The boat 217 is made of, for example, quartz ($SiO_2$), silicon carbide (SiC) or the like.

A heat insulating member 218 made of, for example, a heat resistant material such as quartz ($SiO_2$) or silicon carbide (SiC) is installed under the boat 217. Thus, heat generated from the heater 207 is less likely to be radiated to the seal cap 219 side.

Figure 2:
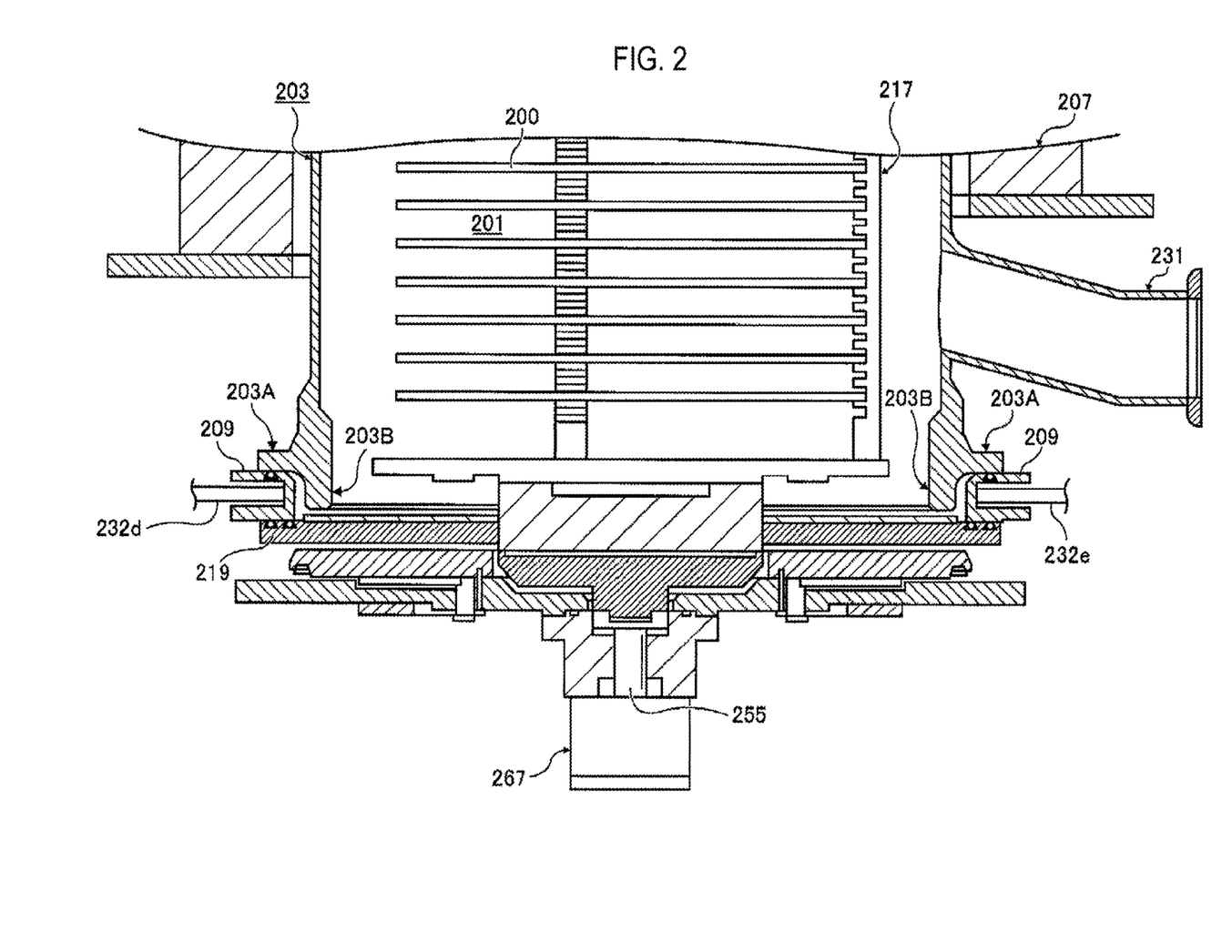
FIG. 2 is a sectional view showing a lower end of a reaction tube suitably used in an embodiment of the present disclosure.
Figure 3:
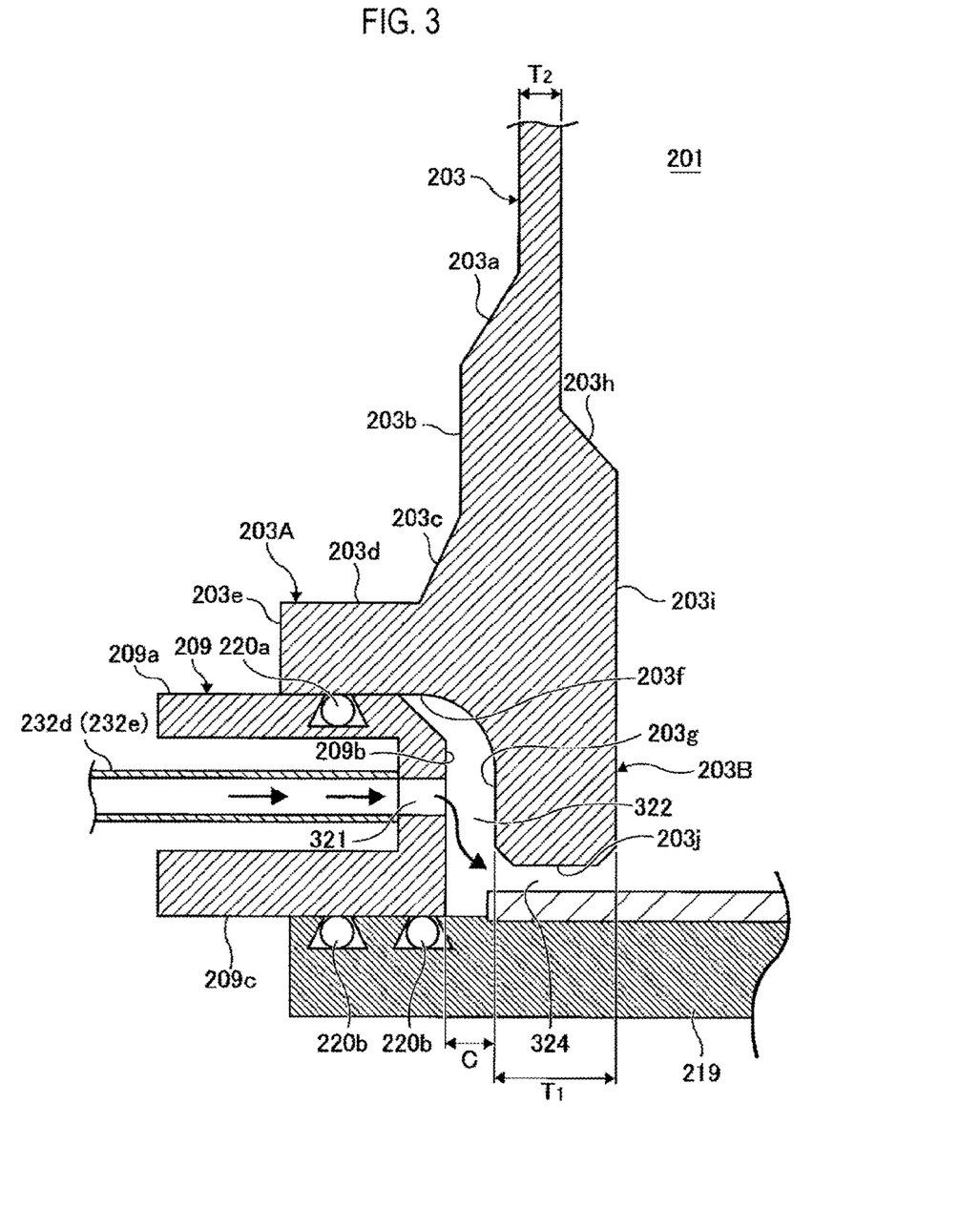
FIG. 3 is a sectional view showing a lower end, i.e., the vicinity of a furnace opening member, of a reaction tube suitably used in an embodiment of the present disclosure.

As shown in FIGS. 2 and 3, the furnace opening member 209 is made of, for example, metal such as stainless steel (SUS material), nickel (Ni) alloy or the like, and is formed in a cylindrical shape with its upper end and lower end opened. The furnace opening member 209 has an upper surface 209a, an inner circumferential surface 209b and a lower surface 209c. An inert gas supply port 321 through which an inert gas is supplied is formed in the inner circumferential surface 209b. Inert gas supply parts 232d and 232e are connected to the inert gas supply port 321.

The inert gas supply part 232e is installed at a position opposite of the inert gas supply part 232d. As a result, an inert gas can be uniformly supplied between the furnace opening member 209 and the reaction tube 203.

An inert gas such as an $N_2$ (nitrogen) gas or the like is supplied from the inert gas supply parts 232d and 232e.

In the lower portion (at the lower end) of the reaction tube 203, there are formed a protrusion portion 203A protruding around the outer peripheral side and an extension portion 203B extending downward from the protrusion portion 203A.

Specifically, the outer peripheral (outer wall) side of the lower portion (lower end) of the reaction tube 203 is formed to protrude outward beyond the outer circumferential surface of a region where the boat 217 is located inside the process chamber 201, i.e., a region where the wafers 200 are accommodated and processed (hereinafter referred to as "substrate treatment region"). The outer peripheral side of the lower portion of the reaction tube 203 is formed of surfaces 203a to 203g. A first surface 203a is an inclined surface formed so as to incline from the outer circumferential surface of the substrate treatment region of the reaction tube 203. A second surface 203b is formed continuously from the first surface 203a in the vertical direction. A third surface 203c is an inclined surface and is formed continuously from the second surface 203b. A fourth surface 203d is formed continuously from the third surface 203c and is formed so as to protrude in a direction orthogonal to the outer circumferential surface of the reaction tube 203. A fifth surface 203e is formed continuously from the fourth surface 203d in the vertical direction. A sixth surface 203f is formed continuously from the fifth surface 20e toward the process chamber 201 and is formed in a direction orthogonal to the outer circumferential surface of the reaction tube 203. A seventh surface 203g is formed continuously from the sixth surface 203f in the vertical direction. A connection surface between the seventh surface 203g and the sixth surface 203f is formed in a rounded shape (R shape).

The protrusion portion 203A as a flange is formed from the fourth surface 203d, the fifth surface 203e and the sixth surface 203f. The first surface 203a to the third surface 203c may be regarded as being included in the protrusion portion 203A. The protrusion portion 203A is installed on the upper surface 209a of the furnace opening member 209 via the O ring 220a.

An inner surface on the inner circumference (inner wall) side of the lower portion (lower end) of the reaction tube 203 is formed so as to protrude more inward (toward the process chamber 201) than the inner surface which is the inner circumferential surface of the substrate treatment region. The inner circumferential side of the lower portion of the reaction tube 203 is formed of surfaces 203h and 203i. An eighth surface 203h is an inclined surface formed so as to incline from the inner circumferential surface of the substrate treatment region of the reaction tube 203. A ninth surface 203i is formed continuously from the eighth surface 203h in the vertical direction. Forming the inclined surface 203h on the inner wall side in this way makes it possible to facilitate the flow of a gas in the process chamber 201 and to prevent the gas from staying in a protruded portion and adversely affecting the film formation. The thickness of the lower end portion of the reaction tube 203 can be made thicker than the thickness of the upper portion of the reaction tube 203 (the position corresponding to the substrate treatment region) by causing the lower portion of the reaction tube 203 to protrude toward the inner circumference side. This makes it possible to increase the physical distance from the process chamber 201 to the furnace opening member 209 and to prevent a gas from entering the furnace opening member 209. In addition, by causing the lower portion of the reaction tube 203 to protrude toward the inner circumference side of the reaction tube 203, as compared with a case where the lower portion of the reaction tube 203 is caused to protrude toward the outer circumference side by the amount of protrusion toward the inner circumference side, it is possible to prevent the reaction tube 203 from becoming larger in the radial direction. This makes it possible to reduce an area (footprint) for installing the reaction tube 203.

The seventh surface 203g and the ninth surface 203i are connected substantially horizontally by a tenth surface 203j. The lower end portion of the reaction tube 203 is formed by the surfaces 203a to 203j.

The extension portion 203B is formed by the seventh surface 203g, the ninth surface 203i and the tenth surface 203j. The extension portion 203B is configured to cover the inner circumferential surface 209b (inner wall surface) of the furnace opening member 209.

A first gap 322 is formed between the inner circumferential surface 209b of the furnace opening member 209 and the outer surface (the seventh surface 203g) of the extension portion 203B. A second gap 324 is formed between the lower end portion (the tenth surface 203j) of the reaction tube 203 and the seal cap 219.

The inert gas supplied from the inert gas supply parts 232d and 232e is supplied toward the extension portion 203B via the inert gas supply port 321. The inert gas flows through the first gap 322 and the second gap 324. The inert gas is supplied into the process chamber 201. Thus, the inner circumferential surface of the furnace opening member 209 is purged with the inert gas. The inert gas is supplied into the first gap 322 at a pressure higher than the internal pressure of the process chamber 201. Internal pressures of the first gap 322 and the second gap 324 are higher than the internal pressure of the process chamber 201. As a result, a flow of inert gas from the second gap 324 into the process chamber 201 is formed. It is therefore possible to prevent the backward diffusion of a gas from the process chamber 201 side into the second gap 324 and the first gap 322. Accordingly, it is possible to suppress the contact between the inner circumferential surface of the furnace opening member 209 and the process gas. Even if a corrosive gas is used as the process gas, it is possible to suppress the corrosion of the furnace opening member and the generation of particles.

A flow rate of the inert gas supplied from the inert gas supply part 232d is made equal to a flow rate of the inert gas supplied from the inert gas supply part 232e. Further, lengths of pipes extending from an inert gas supply source (not shown) to the inert gas supply parts 232d and 232e are made substantially equal to each other. As a result, a uniform gas flow can be formed over the entire circumference of the lower end portion of the reaction tube 203, and the pressure in the first gap 322 can be made substantially uniform over the entire circumference. Thus, a flow velocity of the inert gas flowing from the second gap 324 into the process chamber 201 can be made substantially uniform over the entire circumference. As a result, the inert gas can be supplied from the entire circumference of the lower end portion of the reaction tube 203 into the process chamber 201 at a substantially uniform flow velocity. The concentration of the process gas in the process chamber 201 is not made uneven. It is therefore possible to suppress the deterioration of the uniformity of the film formation on a substrate.

The width of the first gap 322 in the horizontal direction, i.e., the width of a gap C between the inner circumferential surface 209b of the furnace opening member 209 and the extension portion 203B, is smaller (narrower) than the thickness $T_1$ of the extension portion 203B. As a result, even if the flow rate of the inert gas supplied into the first gap 322 is small, the internal pressures of the first gap 322 and the second gap 324 can be made higher than the internal pressure of the process chamber 201. It is therefore possible to form a flow of inert gas from the second gap 324 toward the inside of the process chamber 201. This makes it possible to suppress the backward diffusion of a gas from the process chamber 201 side.

The thickness $T_1$ of the extension portion 203B, which is the lower end of the reaction tube 203, is larger than the thickness $T_2$ which is the thickness at the position corresponding to the substrate treatment region of the reaction tube 203. By doing so, it is possible to increase the reaching distance of the process gas from the side of the process chamber 201 to the furnace opening member 209. This makes it possible to more effectively suppress the backward diffusion of the process gas from the side of the process chamber 201 and the adhesion of the by-products to the furnace opening member 209. Since the inner wall portion (inner circumferential surface) of the extension portion 203B is thermally insulated by the thickness $T_1$ of the extension portion 203B, heat does not escape to the side of the furnace opening member 209. Thus, the inner wall portion (inner circumferential surface) of the extension portion 203B is warmed. This makes it difficult for the inner wall portion (inner circumferential surface) of the extension portion 203B to cool down. It is therefore possible to suppress the adhesion of the by-products to the inner wall portion of the extension portion 203B. Furthermore, even when the reaction tube 203 is placed on a floor for maintenance or the like, the reaction tube 203 can be made self-standing by the thickness $T_1$ of the extension portion 203B. This makes it possible to improve the maintainability. In addition, by making the lower portion of the reaction tube 203 (the portion of the reaction tube 203 in the vicinity of the furnace opening member 209) thicker than the substrate treatment region, it is possible to suppress the generation of cracks on the surface of the reaction tube 203 due to a thermal stress or a film stress. This makes it possible to prevent the lower portion of the reaction tube 203 from being damaged and to increase the strength of the reaction tube 203.

Further, the seventh surface 203g, which is the outer circumferential surface of the extension portion 203B, is disposed more inward (toward the side of the process chamber 201) than the second surface 203b, which is the upper portion of the protrusion portion 203A, i.e., the outer circumferential surface of the reaction tube 203. Accordingly, even if the extension portion 203B is formed at the thickness $T_1$, it is not necessary to shift the protrusion portion 203A outward in the radial direction. This makes it possible to prevent the furnace opening member 209 from shifting outward in the radial direction of the reaction tube 203 and to reduce an installation area (footprint). In addition, the reaction tube 203 can be installed without remodeling the furnace opening member 209 of the conventional apparatus, thereby reducing the cost.

In some embodiments, a transition portion (corner portion) between the outer circumferential surface of the extension portion 203B and the protrusion portion 203A, i.e., a transition portion between the seventh surface 203g and the sixth surface 203f, may have a shape (R shape) rounded upward and outward. This makes it possible to prevent the reaction tube 203 from being broken due to the concentration of thermal stresses at the corner portion, thereby increasing the strength. Furthermore, when an inert gas or the like is supplied toward the extension portion 203B, it is possible to prevent the inert gas from staying at the corner portion and to form a uniform gas flow all around the lower end portion of the reaction tube 203.

In some embodiments, the end portion of the extension portion 203B (a transition portion between the seventh surface 203g and the tenth surface 203j and a transition portion between the ninth surface 203i and the tenth surface 203j) may have a rounded (R) shape.

In some embodiments, both ends of the lower end portion of the extension portion 203B (the transition portion between the seventh surface 203g and the tenth surface 203j and the transition portion between the ninth surface 203i and the tenth surface 203j) may have a smaller rounded (R) shape (a larger curvature shape) than the transition portion between the extension portion 203B and the protrusion portion 203A. As a result, an inert gas flow moving downward along the outer circumferential surface (the seventh surface 203g) of the extension portion 203B can be easily introduced into the second gap 324. Thus, the inert gas is not allowed to stay in the first gap 322. It is therefore possible to form a flow without stagnation from the first gap 322 to the second gap 324. In addition, since the second gap 324 is narrower than the first gap 322, it is possible to secure the flow velocity of the inert gas passing through the second gap 324. Inasmuch as the transition portion between the ninth surface 203i and the tenth surface 203j has a rounded (R) shape, the inert gas of high flow velocity flowing through the second gap 324 can be discharged upward in the process chamber 201. It is therefore possible to suppress the backward diffusion of a gas from the side of the process chamber 201 to the side of the first gap 322. In the present embodiment, for the sake of convenience, the end portion of the extension portion 203B is illustrated to have a rounded (R) shape. However, as shown in FIG. 3, the rounded (R) shape of the end portion of the extension portion 203B may include a shape linearly C-chamfered at an angle of 45 degrees. In addition, the shape of the end portion of the extension portion 203B is not limited to the rounded (R) shape. The same action may be obtained even if the end portion of the extension portion 203B has a notch shape. However, if there is a corner portion, a problem tends to occur in that a gas is likely to stagnate or stay. Therefore, it is better to eliminate the corner portion.

In some embodiments, the inert gas supply parts 232d and 232e may supply an inert gas toward the curve (R)-shaped transition portion between the outer circumferential surface of the extension portion 203B and the protrusion portion 203A. By supplying the inert gas toward the curve (R)-shaped transition portion, it is possible to smoothly form an inert gas flow in the circumferential direction within the first gap 322 and to form a uniform gas flow all around the lower end portion of the reaction tube 203.

Figure 5:
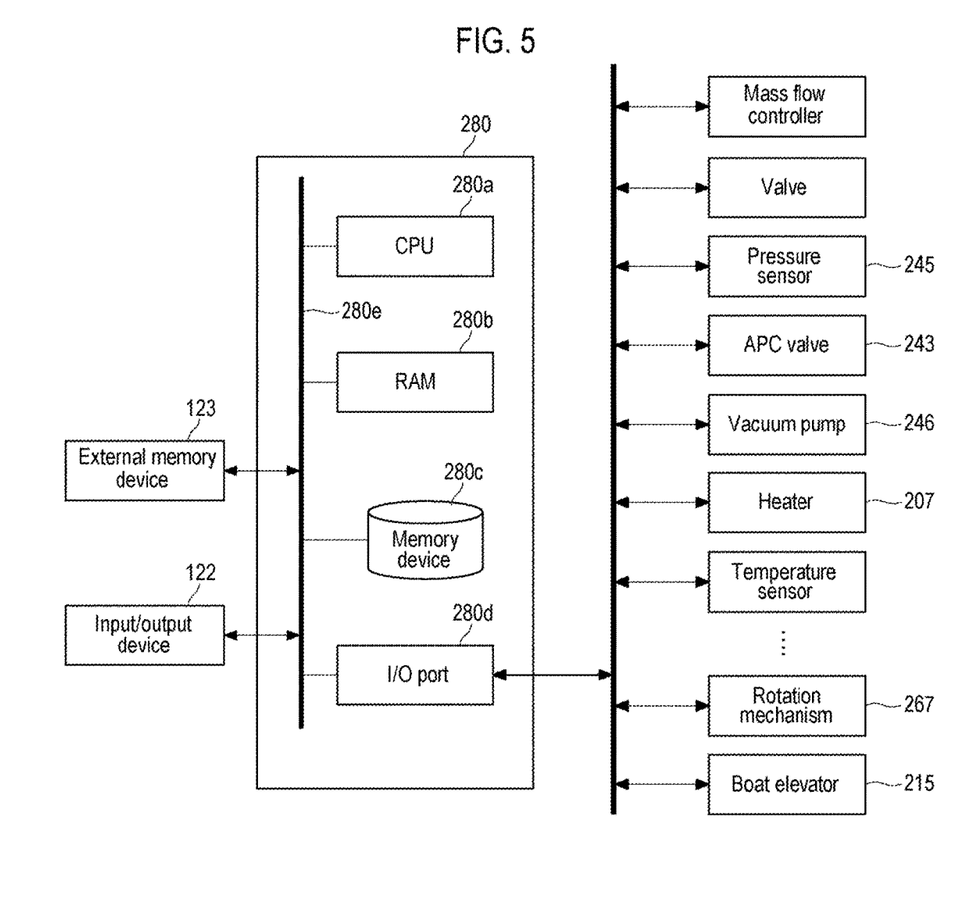
FIG. 5 is a schematic configuration diagram of a controller of a substrate treatment apparatus suitably used in an embodiment of the present disclosure and is a block diagram showing a control system of the controller.

As shown in FIG. 5, the controller 280, which is a control part (control means), is configured as a computer including a CPU (Central Processing Unit) 280a, a RAM (Random Access Memory) 280b, a memory device 280c, and an I/O port 280d. The RAM 280b, the memory device 280c and the I/O port 280d are configured to exchange data with the CPU 280a via an internal bus 280e. An input/output device 122 configured as, for example, a touch panel or the like, is connected to the controller 280.

The memory device 280c is composed of, for example, a flash memory, an HDD (Hard Disk Drive) or the like. In the memory device 280c, a control program for controlling the operation of the substrate treatment apparatus, a process recipe in which procedures and conditions of a substrate treatment to be described later are described, and the like are readably stored. The process recipe functions as a program for causing the controller 280 to execute each sequence in the substrate treatment process, which will be described later, to obtain a predetermined result. Hereinafter, the process recipe and the control program will be generally and simply referred to as a "program." When the term "program" is used herein, it may indicate a case of including only the process recipe, a case of including only the control program, or a case of including both the recipe and the control program. The RAM 280b is configured as a memory area (work area) in which a program or data read by the CPU 280a is temporarily stored.

The I/O port 280d are connected to MFCs (Mass Flow Controllers) (not shown) as flow rate control devices and on-off valves (not shown) for controlling the respective flow rates of the gases flowing through the gas supply parts 232a, 232b, 232c, 232d and 232e, the pressure sensor 245, the APC valve 243, the vacuum pump 246, the heater 207, a temperature sensor (not shown), the rotation mechanism 267, the boat elevator 215 and the like.

The CPU 280a is configured to read and execute the control program from the memory device 280c and to read the process recipe from the memory device 280c in response to an input of an operation command from the input/output device 122, or the like. The CPU 280a controls, according to the contents of the process recipe thus read, the operations of the APC valve 243, the heater 207, the vacuum pump 246, the rotation mechanism 267, the boat elevator 215, and the like.

The controller 280 is not limited to a case where it is configured as a dedicated computer, but may be configured as a general-purpose computer. For example, by preparing an external memory device (for example, a magnetic tape, a magnetic disk such as a flexible disk or a hard disk, an optical disk such as a CD or a DVD, a magneto-optical disk such as an MO or the like, or a semiconductor memory such as a USB memory or a memory card) 123 which stores the aforementioned program, and installing the program in a general-purpose computer using the external memory device 123, it is possible to configure the controller 280 of the present embodiment. However, the means for supplying the program to the computer is not limited to the case where the program is supplied via the external memory device 123. For example, the program may be supplied via a communication means such as the Internet or a dedicated line without going through the external memory device 123. The memory device 280c or the external memory device 123 is configured as a non-transitory computer-readable recording medium. Hereinafter, the memory device 280c and the external memory device 123 will be generally and simply referred to as a "recording medium." When the term "recording medium" is used herein, it may indicate a case of including only the memory device 280c, a case of including only the external memory device 123, or a case of including both the memory device 280c and the external memory device 123.

Subsequently, a substrate treatment process step according to an embodiment of the present disclosure will be described. In the substrate treatment process according to the present embodiment, there will be described a configuration in which $Si_3N_4$ films (hereinafter referred to as SiN films) are formed on a plurality of wafers 200 by using a dichlorosilane ($SiH_2Cl_2$, abbreviation: DCS) gas, which is a silicon-containing gas, as a first process gas, using an $NH_3$ (ammonia) gas, which is a nitrogen-containing gas, as a second process gas, and using an $N_2$ (nitriding) gas, which is an inert gas, as a third process gas. In the following description, the operations of the respective parts constituting the substrate treatment apparatus are controlled by the controller 280.

From the inert gas supply parts 232d and 232e installed in the lower end portion of the reaction tube 203, the $N_2$ gas as an inert gas is supplied at least in a state in which the wafers 200 are being treated. As the inert gas, in addition to the $N_2$ gas, a noble gas such as an Ar gas, a He gas, a Ne gas, a Xe gas or the like may be used.

Once the plurality of wafers 200 is charged into the boat 217 (wafer charging), the lower end opening of the furnace opening member 209 is opened. The boat 217 supporting the plurality of wafers 200 is lifted by the boat elevator 215 and is loaded into the process chamber 201 (boat loading). In this state, the seal cap 219 seals the lower end of the furnace opening member 209 via the O ring 220b.

The internal pressure of the process chamber 201 is adjusted by the pressure sensor 245, the APC valve 243 and the vacuum pump 246 so that the interior of the process chamber 201 has a desired pressure (degree of vacuum). In addition, the process chamber 201 is heated and temperature-controlled by a temperature sensor (not shown) and the heater 207 so that the interior of the process chamber 201 has a desired temperature.

The DCS gas is caused to flow from the first nozzle 233a while operating the vacuum pump 246. The flow rate of the DCS gas is adjusted by a mass flow controller (not shown). The flow rate-adjusted DCS gas is supplied into the process chamber 201 via the first nozzle 233a and is exhausted from the exhaust pipe 231. At the same time, the $N_2$ gas is caused to flow from the third nozzle 233c. The $N_2$ gas is supplied into the process chamber 201 together with the DCS gas and is exhausted from the exhaust pipe 231.

After a silicon-containing layer is formed on the surface or the like of the wafer 200, the supply of the DCS gas is stopped. At this time, the APC valve 243 of the exhaust pipe 231 is kept opened, the interior of the process chamber 201 is evacuated by the vacuum pump 246, and residual DCS gas or the like is removed from the process chamber 201. At this time, if the $N_2$ gas is supplied from the third nozzle 233c into the process chamber 201 (purging), the effect of removing the residual DCS gas is further enhanced.

After purging the interior of the process chamber 201, the $NH_3$ gas is caused to flow from the second nozzle 233b. At the same time, the $N_2$ gas is caused to flow from the third nozzle 233c. The $NH_3$ gas and the $N_2$ gas are supplied into the process chamber 201 and then exhausted from the exhaust pipe 231.

Subsequently, the supply of the $NH_3$ gas is stopped. At this time, the interior of the process chamber 201 is evacuated by the vacuum pump 246 while keeping the APC valve 243 of the exhaust pipe 231 opened, and the unreacted $NH_3$ gas remaining in the process chamber 201 or the $NH_3$ gas which remains after contributing to the nitriding, is removed from the interior of the process chamber 201. At this time, the supply of the $N_2$ gas from the third nozzle 233c into the process chamber 201 is maintained. Thus, the effect of removing the unreacted $NH_3$ gas remaining in the process chamber 201 or the $NH_3$ gas which remains after contributing to the nitriding from the interior of the process chamber 201 is enhanced.

By repeating the above-described process, a SiN film containing silicon and nitrogen and having a predetermined film thickness can be formed on the wafer 200.

After the film forming process of forming the SiN film having a predetermined film thickness is performed, an inert gas such as an $N_2$ gas or the like is supplied into and exhausted from the process chamber 201, whereby the interior of the process chamber 201 is purged with the inert gas. Thereafter, an internal atmosphere of the process chamber 201 is replaced by the inert gas (inert gas replacement), and the internal pressure of the process chamber 201 is restored to atmospheric pressure (atmospheric pressure restoration).

Thereafter, the seal cap 219 is lowered by the boat elevator 215, the lower end of the furnace opening member 209 is opened, and the processed wafers 200 supported by the boat 217 are unloaded from the lower end of the furnace opening member 209 outside the reaction tube 203 (boat unloading). Thereafter, the processed wafers 200 are discharged from the boat 217 (wafer discharging).

As described above, the SiN film can be formed on the surface of the wafer 200 using the DCS gas and the $NH_3$ gas.

The present disclosure may be applied to a case of using hexachlorodisilane ($Si_2Cl_6$, HCDS) and $NH_3$ as well as the case of using the DCS gas and the $NH_3$ gas as the process gases for forming the SiN film. The present disclosure may be applied to a case of using other Si precursors or nitriding precursors. Furthermore, the present disclosure may be applied to a case where an SiN film is formed through a CVD method by simultaneously supplying a Si precursor and a nitriding precursor, as well as the case where the SiN film is formed by alternately supplying the Si precursor and the nitriding precursor.

Figure 4:
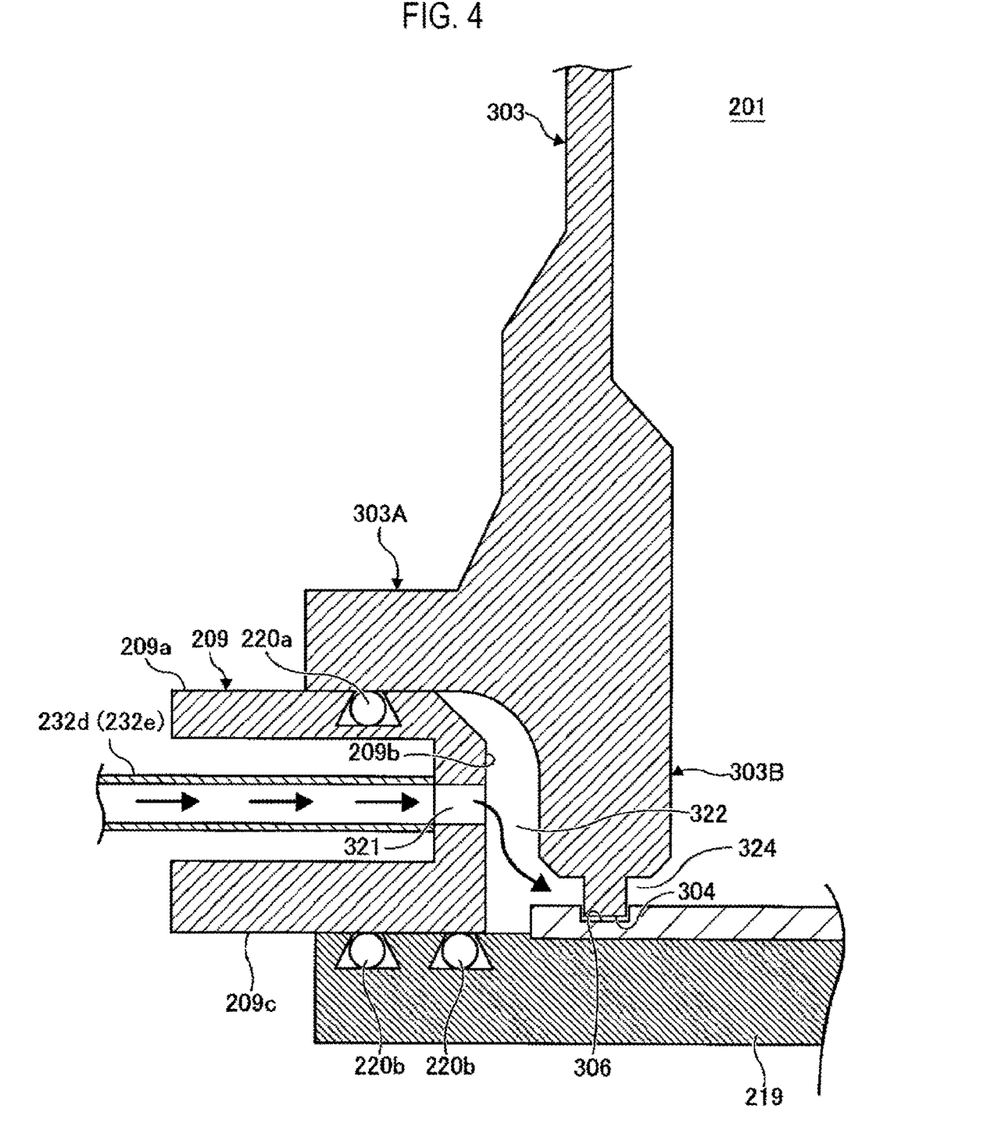
FIG. 4 is a sectional view showing a lower end, i.e., the vicinity of a furnace opening member, of a reaction tube suitably used in another embodiment of the present disclosure.

FIG. 4 is an enlarged sectional view showing a lower end of a reaction tube 303 according to another embodiment of the present disclosure.

The reaction tube 303 according to another embodiment differs from the reaction tube 203 according to the above-described embodiment in that projections 304 are formed in the lower end portion of the extension portion 203B.

The lower end portion of the extension portion 203B has a plurality of projections 304 protruding downward. The upper surface of the seal cap 219 has a plurality of recesses 306 formed to respectively engage with the projections 304.

That is to say, by bringing the projections 304 formed in the lower end portion of the reaction tube 303 into engagement with the respective recesses 306 of the seal cap 219, a portion of the reaction tube 303 is fitted into the seal cap 219.

Even in the reaction tube 303, the inert gas supplied from the inert gas supply parts 232d and 232e is supplied toward the extension portion 203B. The inert gas flows through the first gap 322 and the second gap 324 and is supplied into the process chamber 201. The inert gas is supplied at a pressure higher than the internal pressure of the process chamber 201 to prevent the by-products from entering the second gap 324 and the first gap 322. The inner circumferential surface of the furnace opening member 209 is purged with the inert gas. That is to say, as the projections 304 formed in the lower end portion of the reaction tube 303 engage with the respective recesses 306 of the seal cap 219, the path of the second gap 324 through which the process gas passes is prolonged by at least the length of the inner surfaces of the recesses 306, as compared with a case where the projections 304 are not formed. Thus, the process gas hardly reaches the furnace opening member 209. As a result, the amount of the contact between the inner circumferential surface of the furnace opening member 209 and the process gas is reduced. Even if a corrosive gas is used as the process gas, it is possible to suppress the corrosion of the furnace opening member and to suppress the generation of particles.

While description has been made on the configuration in which the projections 304 are formed in the lower end portion of the extension portion 203B and the recesses 306 engaging with the respective projections 304 are formed in the upper surface of the seal cap 219, the present disclosure is not limited thereto. A plurality of recesses may be formed in the lower end portion of the extension portion and a plurality of projections respectively engaging with the recesses may be formed in the upper surface of the seal cap. In this case, a portion of the reaction tube is fitted into the seal cap by bringing the recesses formed in the lower end portion of the reaction tube into engagement with the projections of the seal cap. In addition, instead of the plurality of projections 304, a projection 304 may be formed over the entire circumference. In this case, a recess 306 may be formed over the entire circumference of the upper surface of the seal cap 219.

While description has been made on the example in which the inert gas is supplied to the lower portion (lower end) of the reaction tube 203 or 303 using the inert gas supply parts 232d and 232e, the present disclosure is not limited thereto. Instead of the inert gas, a cleaning gas such as hydrogen fluoride (HF) or the like may be supplied, or the inert gas and the cleaning gas may be supplied together. By supplying the cleaning gas between the inner circumferential surface of the furnace opening member 209 and the reaction tube 203 or 303, it is possible to remove the by-products and to prevent particles from being generated.

Accordingly, by forming the protrusion portion of the reaction tube so as to cover the upper surface of the furnace opening member, forming the extension portion of the reaction tube so as to cover the inner circumferential surface of the furnace opening member, and supplying the inert gas and/or the cleaning gas between the inner wall side of the furnace opening member and the extension portion, the inner wall surface of the furnace opening member is covered with the inert gas and/or the cleaning gas, thereby preventing the by-products from adhering to the furnace opening member and corrosion of the furnace opening member.

Thus, in the substrate treatment apparatus, it is possible to prevent the contamination of the wafers, prolong the maintenance cycle and enhance the production efficiency.

The present disclosure is not limited to the above-described embodiments. While description has been made on a single tube specification in which only the reaction tube is installed. However, the present disclosure is not limited thereto. For example, the present disclosure may be applied to a double tube specification in which an outer tube and an inner tube are installed, or a specification of triple or more tubes.

Further, in the present embodiment, description has been made on the example in which the furnace opening member 209 is made of a metallic material. However, the present disclosure is not limited thereto. A non-metallic material may also be used.

Further, in the present embodiment, two inert gas supply parts are installed in the lower portion of the reaction tube. However, the present disclosure is not limited thereto. A single inert gas supply part may be installed. In the case where the single inert gas supply part is installed, the single inert gas supply part is installed on the side facing the exhaust pipe. As a result, it is possible to form a smooth flow path for the gas supply and exhaust as a whole.

The present disclosure relates to a semiconductor manufacturing technique, particularly to a heat treatment technique for processing a target substrate in a state in which the target substrate is accommodated in a treatment chamber and heated by a heater. For example, the present disclosure may be effectively applied to a substrate treatment apparatus for performing an oxidation process, a diffusion process, a reflow or annealing process for carrier activation or planarization after ion implantation, and a film forming process using a thermal CVD reaction, with respect to a semiconductor wafer in which a semiconductor integrated circuit device (semiconductor device) is built.

According to the present disclosure, it is possible to suppress an adhesion of by-products to the vicinity of a furnace opening member.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate treatment apparatus, comprising:
   a reaction tube made of a heat resistant material, formed in a cylindrical shape with an upper end of the reaction tube closed and a lower end of the reaction tube opened, and including a substrate treatment region in which substrates are treated; and
   a manifold made of metal, formed into a cylindrical shape, wherein an interior region of a cylinder constituting the manifold has been removed to form an annular ring-shaped opening member, the manifold disposed in a lower portion of the reaction tube, and including:
   an upper surface having a ring shape;
   a lower surface having a ring shape; and an inner circumferential surface connecting an inner circumference of the upper surface and an inner circumference of the lower surface, wherein an upper portion of the inner circumferential surface, which is connected to the upper surface, is chamfered, wherein the reaction tube includes a flange formed to protrude outward in the lower portion of the reaction tube, and an extension portion formed to extend downward from a lower end of the flange, the extension portion being formed to have a thickness larger than a thickness of the reaction tube at a position corresponding to the substrate treatment region, and being configured to cover the inner circumferential surface of the manifold, wherein the manifold is configured to support, on the upper surface of the manifold, the flange of the reaction tube via a seal member, and wherein an inner surface of the extension portion protrudes more inward than an inner surface of the reaction tube at the position corresponding to the substrate treatment region.

2. The apparatus of claim 1, further comprising:
at least one inert gas supply pipe formed in the inner circumferential surface of the manifold and configured to supply an inert gas toward a gap between the inner circumferential surface of the manifold and an outer circumferential surface of the extension portion.

3. The apparatus of claim 2, wherein a transition portion between the outer circumferential surface of the extension portion and the flange has a rounded shape.

4. The apparatus of claim 3, wherein the at least one inert gas supply pipe is further configured to supply the inert gas toward the transition portion.

5. The apparatus of claim 3, wherein both corners of a lower end of the extension portion have a rounded shape and are rounded at a smaller curvature than the transition portion.

6. The apparatus of claim 2, wherein the at least one inert gas supply pipe includes two inert gas supply pipes installed at mutually-opposing positions, and flow rates of the inert gas supplied from the two inert gas supply pipes are equal to each other.

7. The apparatus of claim 6, wherein lengths of pipes extending from an inert gas supply source to the two inert gas supply pipes are equal to each other.

8. The apparatus of claim 2, wherein a horizontal gap between the inner circumferential surface of the manifold and the outer circumferential surface of the extension portion is smaller than the thickness of the extension portion.

9. The apparatus of claim 1, further comprising:
a gas introduction nozzle connected to the lower portion of the reaction tube, and including a vertical portion installed in an arc-shaped space defined between the reaction tube and the substrates,
wherein gas supply holes are formed in a lateral surface of the vertical portion of the gas introduction nozzle, and
wherein an outer circumferential surface of the extension portion is disposed more inward than an outer circumferential surface of the reaction tube at the position corresponding to the substrate treatment region.

10. The apparatus of claim 1, further comprising:
a seal cap configured to air-tightly close a lower end opening of the manifold,
wherein the extension portion has a length set such that a gap between the extension portion and the seal cap is narrower than a gap between the inner circumferential surface of the manifold and an outer circumferential surface of the extension portion.

11. The apparatus of claim 1, further comprising:
a cleaning gas supply pipe configured to supply a cleaning gas toward the extension portion.

12. A reaction tube disposed above a manifold and including a substrate treatment region in which substrate is treated, comprising:
a flange formed to protrude outward in a lower portion of the reaction tube; and
an extension portion formed to extend downward from a lower end of the flange, the extension portion being formed to have a thickness larger than a thickness of the reaction tube at a position corresponding to the substrate treatment region and being configured to cover an inner circumferential surface of the manifold,
wherein the manifold is made of metal and formed into a cylindrical shape, wherein an interior region of a cylinder constituting the manifold has been removed to form an annular ring-shaped opening member, and the manifold is disposed in the lower portion of the reaction tube, and includes:
an upper surface having a ring shape;
a lower surface having a ring shape; and
the inner circumferential surface connecting an inner circumference of the upper surface and an inner circumference of the lower surface,
wherein an upper portion of the inner circumferential surface, which is connected to the upper surface, is chamfered,
wherein the reaction tube is made of a heat resistant material and formed in a cylindrical shape with an upper end of the reaction tube closed and a lower end of the reaction tube opened,
wherein the flange is supported, on the upper surface of the manifold, via a seal member by the manifold,
wherein an outer circumferential surface of the extension portion is disposed more inward than an outer circumferential surface of the reaction tube at the position corresponding to the substrate treatment region, and
wherein an inner surface of the extension portion protrudes more inward than an inner surface of the reaction tube at the position corresponding to the substrate treatment region.

13. A method of manufacturing a semiconductor device, comprising:
purging the inner circumferential surface of the manifold of the substrate treatment apparatus of claim 1, wherein the purging includes supplying an inert gas toward a gap between the inner circumferential surface of the manifold and an outer circumferential surface of the extension portion; and
treating a substrate by controlling a flow of gases within the substrate treatment apparatus.

14. The apparatus of claim 3, wherein an outer surface of the lower portion of the reaction tube comprises:
a first surface formed, at a position lower than an exhaust pipe connected to the reaction tube, to incline from an outer circumferential surface of the reaction tube at the position corresponding to the substrate treatment region in an expanding manner toward the lower end of the reaction tube;
a second surface formed continuously from the first surface in a vertical direction; and
a third surface formed to incline from the second surface and continuously connected with the flange, wherein an inner surface of the lower portion of the reaction tube comprises:
an inner inclined surface, at a position lower than the first surface and higher than the third surface, formed to incline from the inner surface of the reaction tube at the position corresponding to the substrate treatment region in an expanding manner toward the lower end of the reaction tube; and
a vertical surface formed continuously from the inner inclined surface in the vertical direction and constitutes the inner surface of the extension portion.

* * * * *